(12) United States Patent
Sakai et al.

(10) Patent No.: US 11,919,205 B2
(45) Date of Patent: Mar. 5, 2024

(54) MOLD-RELEASE FILM

(71) Applicant: KOBAYASHI & CO.,LTD., Tokyo (JP)

(72) Inventors: Keisuke Sakai, Matsudo (JP); Nanae Tanaka, Matsudo (JP)

(73) Assignee: KOBAYASHI & CO., LTD., Tokyo (JP)

( * ) Notice: Subject to any disclaimer, the term of this patent is extended or adjusted under 35 U.S.C. 154(b) by 0 days.

(21) Appl. No.: 17/792,114

(22) PCT Filed: Jun. 29, 2020

(86) PCT No.: PCT/JP2020/025434
§ 371 (c)(1),
(2) Date: Jul. 11, 2022

(87) PCT Pub. No.: WO2021/220523
PCT Pub. Date: Nov. 4, 2021

(65) Prior Publication Data
US 2023/0054528 A1 Feb. 23, 2023

(30) Foreign Application Priority Data
Apr. 27, 2020 (JP) .................. 2020-078007

(51) Int. Cl.
*B29C 33/68* (2006.01)
*B29C 37/00* (2006.01)
(Continued)

(52) U.S. Cl.
CPC .......... *B29C 33/68* (2013.01); *B29C 37/0075* (2013.01); *B32B 27/08* (2013.01);
(Continued)

(58) Field of Classification Search
None
See application file for complete search history.

(56) References Cited

U.S. PATENT DOCUMENTS

2021/0253815 A1 8/2021 Sakai et al. ............ C08J 7/042
2021/0257228 A1 8/2021 Sakai et al. ........... H01L 21/566

FOREIGN PATENT DOCUMENTS

JP 2012-139846 A 7/2012
JP 2013-123063 A 6/2013
(Continued)

OTHER PUBLICATIONS

Indonesian Office Action dated Jun. 16, 2023, issued by the Directorate General of Intellectual Property in corresponding application ID P00202207871.
(Continued)

*Primary Examiner* — Ramsey Zacharia
(74) *Attorney, Agent, or Firm* — Stein IP, LLC

(57) ABSTRACT

The objective of the present invention is to provide a mold-release film that does not contaminate the mold or the formed body. This invention provides a mold-release film comprising a base material layer formed from a thermoplastic resin, and a surface layer formed from a resin composition layered on at least one surface of the base material layer. The mold-release film has a trouser tear strength, conforming to JIS K 7128-1, of 5 N/mm or stronger. The resin composition has a peel strength of 15 mN/30 mm or weaker, as measured at 175° C. in accordance with JIS Z0237. The resin composition has an elongation at break of 70% or greater, as measured at 175° C. in accordance with JIS K 7127.

3 Claims, 2 Drawing Sheets

(51) Int. Cl.
*B32B 27/08* (2006.01)
*B32B 27/26* (2006.01)
*B32B 27/32* (2006.01)

(52) U.S. Cl.
CPC ............ *B32B 27/26* (2013.01); *B32B 27/322* (2013.01); *B32B 2264/0221* (2013.01); *B32B 2307/5825* (2013.01); *B32B 2307/748* (2013.01)

(56) References Cited

FOREIGN PATENT DOCUMENTS

| | | |
|---|---|---|
| JP | 2015-74201 A | 4/2015 |
| JP | 6562532 B1 | 8/2019 |
| WO | WO 2018/173682 A1 | 9/2018 |
| WO | WO 2019/021814 A1 | 1/2019 |
| WO | WO 2019/244448 A1 | 12/2019 |

OTHER PUBLICATIONS

Japanese Office Action dated Jul. 26, 2023, issued to Japanese Application No. 2020-078007.

[Fig. 1]
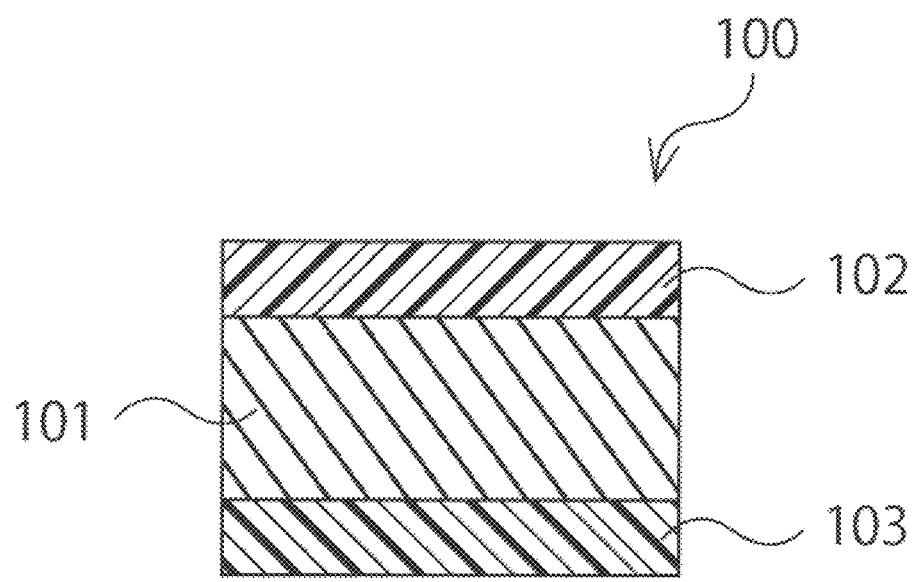

[Fig. 2]
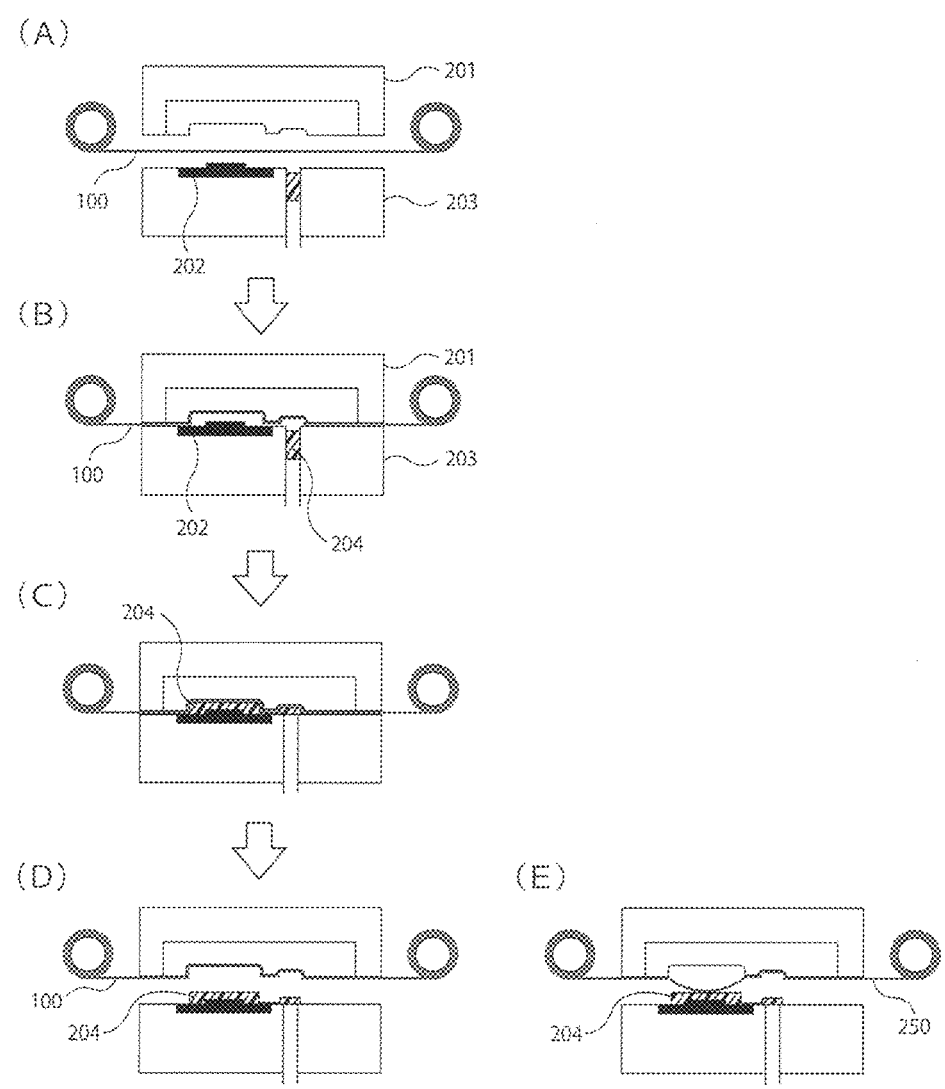

MOLD-RELEASE FILM

CROSS-REFERENCE TO RELATED APPLICATIONS

This application is a national stage of International Application No. PCT.IP2020/025434, filed Jun. 29, 2020, which claims the benefit of Japanese Application No. 2020-078007, filed Apr. 27, 2020, in the Japanese Patent Office, the disclosures of which are incorporated herein by reference.

TECHNICAL FIELD

The present invention relates to a release film, and more particularly to a release film used for sealing a semiconductor element with a resin in flip chip connection.

BACKGROUND ART

In recent years, in response to higher functionality of electronic devices and their expansion into mobile applications, there is an increasing demand for higher density and higher integration of semiconductor devices, and the capacity and density of semiconductor packages have been increasing. In order to further increase the speed and functionality, it is necessary to quickly transmit many signals, and the connection method between the semiconductor element and the package substrate is being changed from the conventional wire bonding connection to the flip chip connection that effects direct connection via solder bumps (connection electrodes) that can increase the number of pins and speed. Furthermore, in order to improve information processing capability, the wiring designed for semiconductor packages is also becoming higher in pitch, the distance between solder bumps and the height of the bumps themselves are decreasing, and narrower pitches and narrower gaps are progressing. In the flip chip connection, it is common to seal a gap between the semiconductor element and the package substrate with a resin composition for the purpose of reinforcing the joint portion and improving reliability.

As a method for sealing with a resin composition, a capillary underfill mode is generally adopted. This method is performed by applying a liquid seal resin composition to one side or a plurality of surfaces of a semiconductor element and allowing the resin composition to flow into a gap between a package substrate and a semiconductor element by utilizing the capillary phenomenon.

In order to reduce assembly costs and the number of processes in recent years, a mold underfill mode (Molded Underfill; MUF) has been developed in which sealing is performed in a state where the release film and the semiconductor element are in direct contact with each other, in order to protect and mask the semiconductor element (Patent Literature 1), as the method for sealing with a resin composition.

CITATION LIST

Patent Literature

Patent Literature 1: Japanese Unexamined Patent Application Publication (JP-A) No. 2013-123063

SUMMARY OF INVENTION

Technical Problem

However, the resin for sealing used in the mold underfill mode has extremely high viscosity in order to improve the filling property for a narrow gap, and it is required to frequently wash the mold, which lowers the production efficiency, and at the same time, it became necessary to purchase many devices.

When a release film is subjected to a high temperature in a mold, components contained in the release film may move to the surface of the release film, and the components that move to the surface may contaminate the mold or a molded article of a sealing resin (hereinafter referred to as "molded article"). When such contamination occurs, the components are required to be removed from a mold or a molded article. In addition, the components are often difficult to remove. Hence, it is desirable that no contamination of a mold or a molded article with the components occurs.

A release film not only usable in molding once but also repeatedly usable in molding multiple times can reduce molding costs. In order to repeatedly use a release film in molding multiple times, the release film is required to maintain its properties through multiple molding operations.

In view of the above circumstances, the present invention is intended to provide a release film that does not contaminate a mold or a molded article. The present invention is also intended to provide a release film that does not contaminate a mold or a molded article and can be repeatedly used in multiple molding processes.

Solution to Problem

The inventors of the present invention have found that a release film having a specific configuration has excellent mold release properties, for example, mold release properties from a scaling resin used in flip chip connection, and has low contamination properties. The inventors of the present invention have further found that the release film can be used in molding multiple times.

That is, the present invention provides a release film having a base layer formed of a thermoplastic resin and a surface layer formed of a resin composition laminated on at least one surface of the base layer, wherein the trouser tear strength in accordance with JIS K7128-1 is 5 N/mm or more, the peeling force of the resin composition is 15 mN/30 mm or less when measured at 175° C. according to JIS Z0237, and the breaking point elongation of the resin composition is 70% or more when measured at 175° C. according to JIS K7127.

The resin composition may be a fluororesin.

The resin composition may contain an isocyanate curing agent.

The resin composition may contain a tetrafluoroethylene resin.

The release film may be used in sealing of a semiconductor to be flip-chip connected.

The release film may be used for molding two or more times.

Advantageous Effects of Invention

The present invention provides a release film having excellent release properties and low contamination. Further, the release film of the present invention can be used repeatedly for multiple moldings.

The effect of the present invention is not necessarily limited to the effect described here, and may be any effect described in the present specification.

BRIEF DESCRIPTION OF DRAWINGS

FIG. 1 is a view showing an example structure of a release film of the present invention.

FIG. 2 are views showing an example usage of a release film of the present invention in transfer molding.

DESCRIPTION OF EMBODIMENTS

Hereinafter, embodiments for carrying out the present invention will now be described in detail. Embodiments described below are merely examples of typical embodiments of the present invention, and the present invention is not limited to these embodiments.

1: Release Film

A release film of the present invention includes a base layer formed of a thermoplastic resin and includes a surface layer formed of a resin composition laminated on at least one surface of the base layer. The surface layer may be laminated on the two surfaces of the base layer. An example structure of the release film of the present invention is shown in FIG. 1. As shown in FIG. 1, a release film 100 of the present invention comprises a base layer 101 and surface layers 102 and 103 laminated on both faces of the base layer. The base layer 101 is formed of a thermoplastic resin. The two surface layers 102 and 103 are formed of a resin composition. The two surface layers 102 and 103 may be formed of the same resin composition or may be formed of different resin compositions.

The release film of the present invention includes the base layer and the surface layers formed on both surfaces of the base layer, and thus has excellent mold release properties and low contamination properties on a mold and/or a molded article in molding. In addition, the release film of the present invention can be used for carrying out a molding process multiple times.

Hereinafter, the release film of the present invention will be described in more detail.

[Base Layer]

The base layer is formed of a thermoplastic resin. The thermoplastic resin may be, for example, a polyester-based resin, a polyolefin-based resin, a polyamide-based resin, or a polyvinyl chloride-based resin. In particular, the thermoplastic resin is preferably a polyester-based resin from the viewpoint of easy peelability from the resin that seals the flip chip and mold followability.

The above-described polyester-based resin is a polymer having an ester bond in the main chain. The polyester-based resin can be, for example, a polymer composed of a polyhydric alcohol and a polybasic acid. The polyester resin may be one or a combination composed of two or more selected from the group consisting of, for example, a polyethylene terephthalate (PET) resin, a polybutylene terephthalate (PBT) resin, a polyethylene naphthalate (PEN) resin, a polybutylene naphthalate (PBN) resin, and a polycarbonate (PC) resin. The polyester-based resin is a resin containing polyester as a main component, and for example, the proportion of polyester to the resin mass can be preferably 90% by mass or more, more preferably 95% by mass or more, and further preferably 98% by mass or more.

The polyester-based resin is preferably a PET resin, and more preferably may be an easily moldable polyethylene terephthalate resin. The easily moldable polyethylene terephthalate resin is a polyethylene terephthalate resin having better moldability than a general-purpose polyethylene terephthalate resin. The base layer formed of the easily moldable polyethylene terephthalate resin particularly contributes to making the release film of the present invention have low contamination properties.

The easily moldable polyethylene terephthalate resin may be, for example, a copolymerized polyethylene terephthalate resin. The copolymerized polyethylene terephthalate may be obtained, for example, by reacting terephthalic acid with ethylene glycol and a copolymerization component, or may be obtained by mixing and melting the polymer of the copolymerization component and polyethylene terephthalate and then performing a distribution reaction.

The copolymerization component may be, for example, an acid component or may be an alcohol component. Examples of the acid component include aromatic dibasic acids (e.g., isophthalic acid, phthalic acid, naphthalenedicarboxylic acid, etc.), aliphatic dicarboxylic acids (e.g., adipic acid, azelaic acid, sebacic acid, decandicarboxylic acid, etc.), and alicyclic dicarboxylic acids (e.g., cyclohexanedicarboxylic acid, etc.). Examples of the alcohol component include aliphatic diols (e.g., butanediol, hexanediol, neopentyl glycol, hexanediol, etc.) and alicyclic diols (e.g., cyclohexanedimethanol, etc.). As the copolymerization component, these compounds may be used singly or in combination of two or more of them. The acid component may specifically be isophthalic acid and/or sebacic acid.

As the base layer formed of the easily moldable polyethylene terephthalate resin used in the present invention, a commercially available material may be used. For example, as the base layer, Teflex (registered trademark) FT, Teflex (registered trademark) FT3, and Teflex (registered trademark) FW2 (all manufactured by Teijin Film Solution Co., Ltd.) can be used. Further, as the base layer, Emblet (registered trademark) CTK-38 (manufactured by Unitika Ltd.) may be used.

The base layer formed of the easily moldable polyethylene terephthalate resin may be produced by a method described, for example, in JP-A No. Hei-2-305827, JP-A No. Hei-3-86729, or JP-A No. Hei-3-110124. According to one preferred embodiment of the present invention, the base layer may be one obtained by biaxially stretching an easily moldable polyethylene terephthalate resin so that a plane orientation coefficient is preferably 0.06 to 0.16, more preferably 0.07 to 0.15, as described in any of these publications.

The glass transition temperature of the easily moldable polyethylene terephthalate resin may be preferably 60° C. to 95° C., and more preferably 65° C. to 90° C. The easily moldable polyethylene terephthalate resin having a glass transition temperature within the above numerical range contributes to making the release film of the present invention usable in molding multiple times.

Ordinary polyethylene terephthalate generally has a glass transition temperature of 100° C. or higher. The glass transition temperature of the easily moldable polyethylene terephthalate resin is lower than the glass transition temperature of the general-purpose polyethylene terephthalate resin. The glass transition temperature is measured by differential thermal analysis (DTA).

The polyolefin-based resin is, for example, a polymer obtained by polymerization using olefins (for example, α-olefins) as a main monomer. The polyolefin-based resin may be, for example, a polyethylene-based resin, a polypropylene-based resin, or a mixture thereof. The polyethylene-based resin is a resin containing polyethylene as a main component, and may for example contain polyethylene at a proportion of preferably 90% by mass or more, more preferably 95% by mass or more, and further preferably 98% by mass or more with respect to the mass of the resin. The polypropylene-based resin is a resin containing polypropylene as a main component, and may for example contain polypropylene at a proportion of preferably 90% by mass or more, more preferably 95% by mass or more, and further preferably 98% by mass or more with respect to the mass of the resin.

The polyamide-based resin is a resin containing polyamide as a main component, and may for example contain polyamide at a proportion of preferably 90% by mass or more, more preferably 95% by mass or more, and further preferably 98% by mass or more with respect to the mass of the resin. The polyamide may be, for example, an aliphatic polyamide, and more specifically, may be polyamide 6, polyamide 6/6, polyamide 6/10, polyamide 11, polyamide 12, or polyamide 6/12.

The polyvinyl chloride-based resin is a resin containing polyvinyl chloride as a main component, and may for example contain polyvinyl chloride at a proportion of preferably 90% by mass or more, more preferably 95% by mass or more, and further preferably 98% by mass or more with respect to the mass of the resin. The polyvinyl chloride may be, for example, a homopolymer of vinyl chloride or a copolymer of vinyl chloride and a comonomer. The comonomer may be, for example, vinyl acetate or ethylene.

The tensile breaking strength of the base layer may be preferably 40 MPa to 200 MPa, more preferably 40 MPa to 120 MPa, further preferably 40 MPa to 110 MPa, and still further preferably 45 MPa to 100 MPa when measured at 175° C. according to JIS K7127.

The tensile breaking elongation of the base layer may be preferably 200% to 500%, more preferably 250% to 450%, and further preferably 300% to 400% when measured at 175° C. according to JIS K7127. The base layer having a tensile breaking strength and/or a tensile breaking elongation within the above numerical range contributes to making the release film of the present invention usable in molding multiple times.

The thickness of the base layer may be, for example, preferably 10 μm to 80 μm, more preferably 15 μm to 75 μm, and further preferably 20 μm to 70 μm. This thickness contributes to enabling the release film of the present invention to be used in a plurality of moldings.

[Surface Layer]

The surface layer constituting the release film of the present invention is formed of a resin composition. The resin composition may be, for example, a fluororesin, an acrylic-based resin, or the like. Among these, a surface layer formed of a fluororesin is preferable in that it can exhibit good peelability while maintaining sufficient heat resistance.

According to a preferred embodiment of the present invention, the fluororesin does not contain chlorine. The fluororesin preferably contains a tetrafluoroethylene resin, and more preferably contains a tetrafluoroethylene resin as a main component. The fact that the tetrafluoroethylene resin is the main component means that the fluororesin consists only of the tetrafluoroethylene resin, or the amount of the tetrafluoroethylene resin among the components contained in the fluororesin is largest. The fluororesin can be, for example, a cured product of a fluororesin composition containing a reactive functional group-containing fluoropolymer and a curing agent.

The reactive functional group-containing fluoropolymer contained in the fluororesin composition may be a fluoropolymer that can be cured by the curing agent. The reactive functional group and the curing agent may be appropriately selected by those skilled in the art.

The reactive functional group may be, for example, a hydroxyl group, a carboxyl group, a group represented by —COOCO—, an amino group, or a silyl group, and is preferably a hydroxyl group. With these groups, the reaction for obtaining the cured product proceeds well.

Of these reactive functional groups, the hydroxyl group is particularly suitable for the reaction for obtaining the cured product. That is, the reactive functional group-containing fluoropolymer may be preferably a hydroxyl group-containing fluoropolymer, and more preferably a hydroxyl group-containing tetrafluoroethylene-based polymer.

The fluorine-containing unit of the reactive functional group-containing fluoropolymer is preferably a fluorine-containing unit based on a perfluoroolefin. The fluorine-containing units based on perfluoroolefin may be more preferably based on one, two or three selected from tetrafluoroethylene (tetrafluoroethylene, hereinafter also referred to as "TFE" in the present specification), hexafluoropropylene (HFP), and perfluoro (alkyl vinyl ether) (PAVE). Preferably, among the fluorine-containing units based on perfluoroolefin, the amount of a fluorine-containing unit based on TFE is the largest.

The hydroxyl value of the reactive functional group-containing fluoropolymer (particularly, the hydroxyl value of the hydroxyl group-containing fluoropolymer) may be preferably 10 mgKOH/g to 300 mgKOH/g, more preferably 10 mgKOH/g to 200 mgKOH/g, and further preferably 10 mgKOH/g to 150 mgKOH/g. When the hydroxyl value of the reactive functional group-containing fluoropolymer is at least the lower limit of the above numerical range, the curability of the resin composition can be improved. Further, the fact that the hydroxyl value of the reactive functional group-containing fluoropolymer is not more than the upper limit of the above numerical range contributes to making the cured product of the resin composition suitable for multiple molding. The hydroxyl value is obtained by measuring by a method in accordance with JIS K0070.

The acid value of the reactive functional group-containing fluoropolymer (particularly the acid value of the hydroxyl group-containing fluoropolymer) may be preferably 0.5 mgKOH/g to 100 mgKOH/g, and more preferably 0.5 mgKOH/g to 50 mgKOH/g. When the acid value of the reactive functional group-containing fluoropolymer is at least the lower limit of the above numerical range, the curability of the resin composition can be improved. Further, the fact that the acid value of the reactive functional group-containing fluoropolymer is not more than the upper limit of the above numerical range contributes to making the cured product of the resin composition suitable for a plurality of moldings.

The reactive functional group of the reactive functional group-containing fluoropolymer may be introduced into the fluoropolymer by copolymerizing a monomer having the reactive functional group with a fluorine-containing monomer (particularly, the perfluoroolefin). That is, the reactive functional group-containing fluoropolymer may contain a polymerization unit based on the reactive functional group-containing monomer and a polymerization unit based on the fluorine-containing monomer (particularly the perfluoroolefin).

When the reactive functional group is a hydroxyl group, the monomer having the reactive functional group may be preferably a hydroxyl group-containing vinyl ether or a hydroxyl group-containing allyl ether. Examples of the hydroxyl group-containing vinyl ether include 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether, and examples of the hydroxyl group-containing hydroxyl group-containing allyl ether include 2-hydroxyethyl allyl ether, 4-hydroxybutyl allyl ether, and glycerol monoallyl ether. Alternatively, the monomer having the reactive functional group may be, for example, a hydroxyalkyl ester of (meth) acrylic acid such as 2-hydroxyethyl acrylate and 2-hydroxyethyl methacrylate. As the monomer having the reactive functional group, one or a combination of two or more of these compounds may be used. When the reactive functional group is a hydroxyl group, the monomer having the reactive functional group is more preferably a hydroxyl group-containing vinyl ether, and particularly preferably 4-hydroxybutyl vinyl ether and/or 2-hydroxyethyl vinyl ether, from the viewpoint of curability of the resin composition.

When the reactive functional group is a carboxyl group, the monomer having the reactive functional group may be preferably an unsaturated carboxylic acid, an ester of an unsaturated carboxylic acid, or an acid anhydride of an unsaturated carboxylic acid.

When the reactive functional group is an amino group, the monomer having the reactive functional group may be, for example, aminovinyl ether or allylamine.

When the reactive functional group is a silyl group, the monomer having the reactive functional group may be preferably a silicone-based vinyl monomer.

The fluorine-containing monomer is preferably a perfluoroolefin. Examples of perfluoroolefins include tetrafluoroethylene (TFE), hexafluoropropylene (HFP), and perfluoro(alkyl vinyl ether) (PAVE). Preferably, the fluorine-containing monomer contains TFE.

Preferably, the reactive functional group-containing fluoropolymer may contain a polymerization unit based on a fluorine-free vinyl monomer in addition to a polymerization unit based on the reactive functional group-containing monomer and a polymerization unit based on the fluorine-containing monomer. The fluorine-free vinyl monomer may be, for example, one or a combination of two or more selected from the group consisting of carboxylic acid vinyl esters, alkyl vinyl ethers, and non-fluorinated olefins.

Examples of the carboxylic acid vinyl ester include vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl p-t-butylbenzoate.

Examples of the alkyl vinyl ether include methyl vinyl ether, ethyl vinyl ether, butyl vinyl ether, and cyclohexyl vinyl ether.

Examples of the non-fluorinated olefin include ethylene, propylene, n-butene, and isobutene.

Further, the reactive functional group-containing fluoropolymer may contain, in addition to the polymerization unit based on a reactive functional group-containing monomer and the polymerization unit based on a fluorine-containing monomer as a perfluoroolefin, a polymerization unit based on a fluoromonomer other than the perfluoroolefin, such as vinylidene fluoride (VdF), chlorotrifluoroethylene (CTFE), vinyl fluoride (VF), and fluorovinyl ether.

The reactive functional group-containing fluoropolymer may be, for example, TFE/non-fluorinated olefin/hydroxybutyl vinyl ether-based copolymer. TFE/carboxylic acid vinyl ester/hydroxybutyl vinyl ether-based copolymer, or TFE/alkyl vinyl ether/hydroxybutyl vinyl ether-based copolymer.

More specifically, the reactive functional group-containing fluoropolymer may be TFE/isobutylene/hydroxybutyl vinyl ether-based copolymer. TFE/vinyl versatate/hydroxybutyl vinyl ether-based copolymer, or TFE/VdF/hydroxybutyl vinyl ether-based copolymer. The reactive functional group-containing fluoropolymer may be particularly preferably TFE/isobutylene/hydroxybutyl vinyl ether-based copolymer or TFE/vinyl versatate/hydroxybutyl vinyl ether-based copolymer.

As the reactive functional group-containing fluoropolymer, for example, products of the Zeffle GK series can be used.

The curing agent contained in the fluororesin composition may be appropriately selected by those skilled in the art depending on the type of the reactive functional group contained in the reactive functional group-containing fluoropolymer.

When the reactive functional group is a hydroxyl group, the curing agent may be preferably one or a combination of two or more selected from an isocyanate curing agent, a melamine resin, a silicate compound, and an isocyanate group-containing silane compound.

When the reactive functional group is a carboxyl group, the curing agent may be preferably one or a combination of two or more selected from an amino curing agent and an epoxy curing agent.

When the reactive functional group is an amino group, the curing agent may be one or a combination of two or more selected from a carbonyl group-containing curing agent, an epoxy curing agent, and an acid anhydride curing agent.

The content of the curing agent in the fluororesin composition is, for example, preferably 15 parts by mass to 30 parts by mass, and more preferably 10 parts by mass to 25 parts by mass with respect to 100 parts by mass of the reactive functional group-containing fluoropolymer. These numerical ranges also apply to the content of the curing agent in the cured product of the fluororesin composition.

The content of the curing agent may be measured by a pyrolysis gas chromatograph (Py-GC/MS) method.

In one embodiment of the present invention, the reactive functional group contained in the reactive functional group-containing fluoropolymer may be a hydroxyl group and the curing agent may be an isocyanate curing agent. In this embodiment, the isocyanate curing agent is preferably hexamethylene diisocyanate (HDI) polyisocyanate.

The content of the HDI poly isocyanate in the fluororesin composition is, for example, preferably 15 parts by mass to 50 parts by mass, more preferably 20 parts by mass to 40 parts by mass, and further preferably 23 parts by mass to 35 parts by mass with respect to 100 parts by mass of the reactive functional group-containing fluoropolymer. These numerical ranges also apply to the content of the HDI polyisocyanate in the cured product of the fluororesin composition.

As the HDI polyisocyanate, for example, one or a combination of two or more selected from isocyanurate-type polyisocyanate, adduct-type poly isocyanate, and biuret-type polyisocyanate can be used. In the present invention, the isocyanate curing agent may preferably be an isocyanurate-type polyisocyanate and/or an adduct-type polyisocyanate, and more preferably a combination of an isocyanurate-type polyisocyanate and an adduct-type polyisocyanate.

When a combination of isocyanurate-type polyisocyanate and adduct-type polyisocyanate is used as the curing agent, the mass ratio of them is, for example, preferably 10:6 to 10:10, more preferably 10:7 to 10:9. The total amount of both may be, for example, preferably 15 parts by mass to 50 parts by mass, more preferably 20 parts by mass to 40 parts by mass, and further preferably 25 parts by mass to 35 parts by mass with respect to 100 parts by mass of the reactive functional group-containing fluoropolymer.

The content ratio of these curing agents may be determined by a pyrolysis gas chromatograph (Py-GC/MS) method.

The fluororesin forming the surface layer contains particles having an average particle size of preferably 1 µm to 10 µm, more preferably 2 µm to 9 µm, measured according to a laser diffraction type particle size analysis measurement method. By containing the particles, the mold release properties of the release film can be enhanced.

The particles are preferably inorganic particles or organic particles. Examples of the inorganic particles include silicon dioxide (particularly amorphous silicon dioxide), calcium carbonate, magnesium carbonate, calcium phosphate, kaolin, talc, aluminum oxide, titanium oxide, alumina, barium sulfate, calcium fluoride, lithium fluoride, zeolite, and molybdenum sulfide. Examples of the organic particles include crosslinked polymer particles and calcium oxalate. In the present invention, the particles are preferably inorganic particles, more preferably silicon dioxide particles, and further preferably amorphous silicon dioxide. Amorphous silicon dioxide may be sol-gel type silica. As the amorphous silicon dioxide, for example, amorphous silicon dioxide of the Sylysia series can be used.

The content of the particles in the fluororesin composition may be, for example, preferably 10 parts by mass to 30 parts by mass, more preferably 12 parts by mass to 25 parts by mass, and further preferably 15 parts by mass to 20 parts by mass with respect to 100 parts by mass of the reactive functional group-containing fluoropolymer. These numerical ranges also apply to the content of the particles in the cured product of the fluororesin composition.

The content of the particles may be measured by thermogravimetric analysis (TGA).

The fluororesin composition may contain a solvent. The type of solvent may be appropriately selected by those skilled in the art. Examples of the solvent include butyl acetate, ethyl acetate, and methyl ethyl ketone (also referred to as MEK). For example, a mixture of these three types can be used as the solvent.

The fluororesin composition may contain a release accelerator. Examples of the release accelerator include amino-modified methylpolysiloxane, epoxy-modified methylpolysiloxane, carboxy-modified methylpolysiloxane, and carbinol-modified methylpolysiloxane. Preferably, the release accelerator is amino-modified methylpolysiloxane.

The content of the release accelerator is, for example, preferably 0.01 parts by mass to 3 parts by mass, more preferably 0.05 parts by mass to 2 parts by mass, and further preferably 0.1 parts by mass to 1 part by mass with respect to 100 parts by mass of the reactive functional group-containing fluoropolymer. These numerical ranges also apply to the content of the release accelerator in the cured product of the fluororesin composition.

The thickness of the surface layer may be, for example, preferably 1 µm to 10 µm, more preferably 2 to 9 µm, and further preferably 3 µm to 8 µm.

The fluororesin composition can be produced by mixing and stirring the components described above by means known to those skilled in the art. A Mixer such as, for example, a high speed mixer, homomixer, paint shaker, or the like can be used for the mixing and stirring. For the mixing and stirring, a dissolver such as, for example, an edge turbine type high speed dissolver, or the like may be used.

The cured product of the fluororesin composition is obtained by applying the fluororesin composition to at least one surface of the base layer and heating it at, for example, preferably 100° C. to 200° C., more preferably 120° C. to 180° C. for, for example, preferably 10 seconds to 240 seconds, more preferably 30 seconds to 120 seconds. The cured product forms the surface layer. The amount of the fluororesin composition to be applied may be appropriately set by those skilled in the art according to the thickness of the surface layer to be formed.

Of the two surface layers laminated on both sides of the base layer, one surface layer is in contact with the mold in the production of the flip chip resin molded article, and the other surface layer is in contact with the molded article in the production of the molded article. In the present specification, the surface layer in contact with the mold is referred to as a mold-side surface layer, and the surface layer in contact with the molded article is referred to as a molded article-side surface layer. The composition of the mold-side surface layer and the composition of the molded article-side surface layer may be the same or different.

The release accelerator is preferably contained in the fluororesin of the molded article-side surface layer. The release accelerator may be contained in both fluororesins of the mold-side surface layer and the molded article-side surface layer.

In one preferred embodiment of the present technology, the mold-side surface layer is formed of a cured product of a fluororesin composition containing the reactive functional group-containing fluoropolymer, the curing agent and the particles, and the molded article-side surface layer is formed of a cured product of a fluororesin composition containing the reactive functional group-containing fluoropolymer (particularly, a hydroxyl group-containing tetrafluoroethylene polymer), the curing agent, the particles, and the release accelerator.

More preferably, the mold-side surface layer is formed of a cured product of a fluororesin composition containing a hydroxyl group-containing tetrafluoroethylene polymer, HDI polyisocyanate, and silicon dioxide particles, and the molded article-side surface layer is formed of a cured product of a fluororesin composition containing a hydroxyl group-containing tetrafluoroethylene polymer, HDI polyisocyanate, silicon dioxide particles, and amino-modified methylpolysiloxane.

Having such two surface layers particularly contributes to imparting excellent mold release properties to the release film of the present invention.

[Features of Release Film]

According to a preferred embodiment of the present invention, the trouser tear strength of the release film of the present invention is 5 N/mm or more, preferably 6 N/mm or more, more preferably 10 N/mm or more, further preferably 20 N/mm or more, and still further preferably 25 N/mm or more, when measured according to JIS K7128-1. The trouser tear strength may satisfy the above range in at least one of the TD direction and the MD direction of the release film, and more preferably the above range is satisfied in both directions.

The peeling force of the resin composition forming the surface layer of the release film of the present invention is 15 mN/30 mm or less, preferably 10 mN/30 mm or less, and more preferably 8.5 mN/30 mm or less, when measured at 175° C. according to JIS Z0237. A thermosetting resin such as an epoxy resin is used as the resin for sealing the semiconductor element used in flip chip connection. In the present invention, the peeling force of the resin composition means, for example, the peeling force with respect to the epoxy resin used for such semiconductor sealing.

The break point elongation of the resin composition forming the surface layer of the release film of the present invention is 70% or more, preferably 100% or more, more preferably 150% or more, and further preferably 250% or more, when measured at 175° C. according to JIS K7127.

[Applications of Release Film]

The release film of the present invention may be used in sealing (molding) of a flip chip-connected semiconductor element.

The release film of the present invention may be used, for example, by being arranged between a mold and a flip chip resin (underfill resin) in flip chip connection. Further, the release film of the present invention may be used, for example, by being arranged between a mold and a resin in transfer mold molding for sealing of a flip chip-connected semiconductor element. The sealing (molding) temperature in the sealing (molding) in which the release film of the present invention is used may be, for example, 100° C. to 250° C., and preferably 120° C. to 200° C.

An example of how to use the release film of the present invention in transfer mold molding used for sealing a flip-chip-connected semiconductor element will be described with reference to FIG. 2.

An example of how to use the release film of the present invention in transfer mold molding will be described with reference to FIG. 2. As shown in FIG. 2(A), the release film 100 of the present invention is arranged between the upper mold 201 and the lower mold 203 on which the semiconductor element mounting substrate 202 is mounted. Next, as shown in FIG. 2(B), the upper mold 201 is brought into contact with the substrate 202 and the lower mold 203 in a state where the release film 100 is attached to the inner surface of the mold 201. Next, as shown in FIG. 2(C), the resin 204 is introduced between the upper mold 201 and the substrate 202, and then the resin 204 is cured. After curing, the upper mold 201 is separated from the substrate 202 as shown in FIG. 2 (D). Since the release film of the present invention is excellent in mold release properties, it is possible to smoothly release the cured resin 204 from the upper mold 201 in the step of FIG. 2(D). If the mold release properties of the release film are not good, the release film 250 may stick to the cured resin 204, for example, as shown in FIG. 2 (E).

Examples of the resin used for sealing the semiconductor element in such transfer mold molding include epoxy resins and silicone resins. The release film of the present invention can be used for sealing a semiconductor element using such a resin.

The release film of the present invention can be used for molding, for example, preferably 2 times or more, more preferably 4 times or more, further preferably 5 times or more, still further preferably 6 times or more, and particularly preferably 8 times or more. The release film of the present invention can be used for molding, for example, preferably 2 times to 20 times, more preferably 4 times to 15 times, further preferably 5 times to 15 times, still further preferably 6 times to 15 times, particularly preferably 8 times to 12 times. The release film of the present invention maintains its performance through multiple releases and is not easily broken. Therefore, the release film of the present invention can be used for a plurality of moldings. This makes it possible to reduce the sealing (molding) cost.

[Method of Manufacturing Release Film]

The present invention provides a method of manufacturing the release film described above. The manufacturing method includes an applying step of applying a resin composition onto at least one surface of a base layer formed of a thermoplastic resin, and a curing step of, after the applying step, curing the resin composition.

The above explanation applies also to the base layer and the resin composition used in the applying step, and the description thereof is omitted.

The applying step may appropriately be carried out by those skilled in the art so as to achieve intended layer thickness. For example, the resin composition can be applied onto at least one surface of the base layer by gravure rolling, reverse rolling, offset gravure coating, kiss coating, reverse kiss coating, wire bar coating, spray coating, or impregnation coating. An apparatus for applying by such a method may appropriately be selected by those skilled in the art.

The curing step includes heating the resin composition at, for example, preferably 100° C. to 200° C., more preferably 120° C. to 180° C. for, for example, preferably 10 seconds to 240 seconds, more preferably 30 seconds to 120 seconds. By the heating, the resin composition is cured.

EXAMPLES

Hereinafter, the present invention will be described in more detail based on examples. The examples described below show examples of typical examples of the present invention, and the scope of the present invention is not limited to these examples.

Test Category 1 (Evaluation of Resin Composition Coating Film Forming Surface Layer)

In order to evaluate the physical properties of the resin composition forming the surface layer of the release film of the present invention, a resin composition for forming a resin composition coating film as shown below was prepared.

Preparation of Resin Composition (A-1)

100 parts by mass of hydroxyl group-containing tetrafluoroethylene resin composition (Zeffle (registered trademark) GK570, Daikin Kogyo Co., Ltd., of which 65% by mass is hydroxyl group-containing tetrafluoroethylene resin), 12.9 parts by mass of isocyanurate-type polyisocyanate (curing agent, Sumidule (registered trademark) N3300, Sumitomo Bayer Urethane Co., Ltd.), 2.6 parts by mass of adduct-type polyisocyanate (curing agent, Duranate (registered trademark) AE700-100), and 45 parts by mass of ethyl acetate were mixed and stirred, to prepare a fluororesin composition (A-1).

The fluororesin composition was applied to a separator (polypropylene plate). The application was performed with a kiss-reverse coating apparatus. After the application, the composition was cured by heating at 150° C. for 30 seconds and aged at 60° C. for 1 day. After aging, the separator coated with the fluororesin composition was cut into pieces having a size of 150 mm×15 mm, and the cured fluororesin composition was released from the separator to obtain a resin composition coating film.

Preparation of Resin Composition (A-2)

A resin composition (A-2) was prepared by the same method as for the above resin composition (A-1) except that 10 parts by mass of isocyanurate type polyisocyanate (curing agent, Sumidule (registered trademark) N3300, Sumitomo Bayer Urethane Co., Ltd.), 7.8 parts by mass of adduct type polyisocyanate (curing agent. Duranate (registered trademark) AE700-100), and 48 parts by mass of ethyl acetate were mixed, and a coating film of the resin composition was further obtained.

Preparation of Resin Composition (A-3)

A resin composition (A-3) was prepared by the same method as for the above resin composition (A-1) except that 8.6 parts by mass of isocyanurate type polyisocyanate (curing agent, Sumidule (registered trademark) N3300, Sumitomo Bayer Urethane Co., Ltd.), 10.4 parts by mass of adduct type polyisocyanate (curing agent. Duranate (registered trademark) AE700-100) and 50 parts by mass of ethyl acetate were mixed, and a coating film of the resin composition was further obtained.

Formation of Resin Composition Film (RA-1)

A resin composition (RA-1) was prepared by the same method as for the above-mentioned resin composition film (A-1) except that 14 parts by mass of isocyanurate type polyisocyanate (curing agent. Sumidule (registered trademark) N3300, Sumitomo Bayer Urethane Co., Ltd.) and 0 part by mass of adduct type polyisocyanate (curing agent, Duranate (registered trademark) AE700-100) were mixed, and a coating film of the resin composition was further obtained.

Formation of Resin Composition Film (RA-2)

100 parts by mass of UV curable acryl acrylate resin composition (RA-2. SEIKO PMC Corp., 35% of which is acryl acrylate resin), and 5 parts by mass of photoinitiator (Irgacure (registered trademark) 184, BASF Co., Ltd.) were mixed and stirred to prepare a UV curable resin composition (RA-2). The UV curable resin composition was applied to a separator (polypropylene plate). The application was performed with a kiss reverse coating apparatus. After the application, the composition was heated at 100° C. for 30 seconds and then cured by 600 mJ irradiation with a high-pressure mercury lamp 120 W/cm. After curing, the separator coated with the U V curable resin composition was cut into pieces having a size of 150 mm×15 mm, and the cured UV curable resin composition was released from the separator to obtain a resin composition coating film.

[Evaluation of Followability of Surface Layer (Release Layer)]

The above resin composition coating film (A-1 to RA-1) test pieces were tested using a tensile tester with constant temperature bath (Shimadzu Autograph AG-IS MS (floor-standing) type) and the breaking point elongation (%) at a measurement temperature of 175° C. was measured at a grip width of 20 mm and a measurement speed of 20 mm/min in accordance with JIS K7127. The measured value of breaking point elongation (%) was calculated from the average value of 10 test pieces. The results are shown in Table 1.

TABLE 1

|  |  | A-1 | A-2 | A-3 | RA-1 | RA-2 |
|---|---|---|---|---|---|---|
| Resin composition | Fluororesin (GK570) | 100 | 100 | 100 | 100 |  |
|  | UV curable resin |  |  |  |  |  |
|  | Ethyl acetate | 45 | 48 | 50 |  |  |
| Curing agent | N3300 | 12.9 | 10 | 8.6 | 14 |  |
|  | AE-700 | 2.6 | 7.8 | 10.4 | 0 |  |
| Total amount |  | 160.5 | 165.8 | 169 |  |  |
| N.V |  | 50 | 50 | 50 |  |  |
| Curing agent blending ratio | N3300 | 9 | 7 | 6 | 10 |  |
| (on a molar basis) | AE-700 | 1 | 3 | 4 | 0 |  |
| Peeling force (mN/30 mm) |  | 8.5 | 8.5 | 8.5 | 8.5 | 36 |
| Breaking point elongation (% GL) |  | 173 | 304 | 344 | 16 | 70 |

[Evaluation of Mold Release Properties of Surface Layer (Release Layer)]

A polyethylene terephthalate (PET) single film was placed on a hot plate, 0.5 g of the following black epoxy resin was applied onto it, and on the epoxy resin coated surface, a test piece having a width of 30 mm and a length of 100 mm obtained by applying a resin composition on a polyester film was aligned with the coated surface of the resin composition, and the black epoxy resin was cured at a heating temperature of 175° C. for 5 minutes. After curing, a tensile peeling tester (VPA-2 manufactured by Kyowa Interface Science Co., Ltd.) was used to measure the peeling force, and the peeling force between the test piece and the epoxy resin was measured.

Black epoxy resin: An epoxy resin composition obtained by adding 83% by mass of a filler having a filler diameter of 20 μm/55 μm, spherical silica in this case, to an epoxy resin ("EF-200" manufactured by SANYU REC Co., Ltd.) and subjecting to a gelling treatment was used.

Peeling conditions: Peeling was performed under the conditions of a peeling speed of 100 mm/min and a peeling temperature of 175° C. in accordance with JIS Z0237. The results are also shown in Table 1.

Test Category 2 (Evaluation of Release Film)

[Trouser Tear Strength of Release Film]

A 150 mm×50 mm test piece was cut out from the release films of the following Examples and Comparative Examples, and a 75 mm cut was made from the midpoint of the short side in the long side direction of the test piece, and Tensilon universal testing machine (A & D Co., Ltd., RTG-1210) was used to measure the trouser tear strength at a chuck distance of 75 mm and a measurement speed of 200 mm/min in accordance with JIS K7128-1. The results are shown in Table 2 below.

Example 1

As a base layer, a film formed of an easily moldable polyethylene terephthalate resin (Teflex (registered trademark) FT. Teijin Limited, thickness 50 μm, glass transition temperature 90° C.) was prepared.

The resin composition (A-1) was applied onto both surfaces of the film. The application was performed with a kiss reverse coating apparatus. After the application, the resin composition (A-1) was cured by heating at 150° C. for 60 seconds, and a release film in which a fluororesin layer was laminated on both sides of an easily moldable PET resin film (hereinafter, referred to as "release film of Example 1") was obtained.

The thickness of the release film of Example 1 was 70±5 μm. The thickness of the base layer in the release film of Example 1 was 50 μm±10%. The thickness of the surface layer of the release film of Example 1 was 5.5±0.5 μm.

The trouser tear strength of the release film of Example 1 was measured according to JIS K7128-1 and found to be 27.77 N/mm. The peeling force of the resin composition (A-1) in the release film was measured at 175° C. according to JIS Z0237 and found to be 8.5 mN/30 mm.

Example 2

A release film (hereinafter referred to as "release film of Example 2") was obtained by the same method as in Example 1 except that the resin composition (A-2) was used.

The thickness of the release film of Example 2 was 70±5 μm. The thickness of the base layer in the release film of Example 2 was 50 μm±10%. The thickness of the surface layer of the release film of Example 2 was 5.5±0.5 μm.

The trouser tear strength of the release film of Example 2 was measured according to JIS K7128-1 and found to be 27.77 N/mm. The peeling force of the resin composition (A-2) in the release film was measured at 175° C. according to JIS Z0237 and found to be 8.5 mN/30 mm.

Example 3

A release film (hereinafter referred to as "release film of Example 3") was obtained by the same method as in Example 1 except that the resin composition (A-3) was used.

The thickness of the release film of Example 3 was 70±5 μm. The thickness of the base layer in the release film of Example 3 was 50 μm±10%. The thickness of the surface layer of the release film of Example 3 was 5.5 t 0.5 μm.

The trouser tear strength of the release film of Example 3 was measured according to JIS K7128-1 and found to be 27.77 N/mm. The peeling force of the resin composition (A-3) in the release film was measured at 175° C. according to JIS Z0237 and found to be 8.5 mN/30 mm.

Comparative Example 1

A release film (hereinafter referred to as "release film of Comparative Example 1") was obtained by the same method as in Example 1 except that the resin composition (RA-1) was used.

The thickness of the release film of Comparative Example 1 was 70 t 5 μm. The thickness of the base layer in the release film of Comparative Example 1 was 50 μm±10%. The thickness of the surface layer of the release film of Comparative Example 1 was 5.5±0.5 μm.

The trouser tear strength of the release film of Comparative Example 1 was measured according to JIS K7128-1 and found to be 27.77 N/mm. The peeling force of the resin composition (RA-1) in the release film was measured at 175° C. according to JIS Z0237 and found to be 8.5 mN/30 mm.

Comparative Example 2

A release film (hereinafter referred to as "release film of Comparative Example 2") was obtained by the same method as in Example 1 except that the resin composition (RA-2) was used.

The thickness of the release film of Comparative Example 2 was 70±5 μm. The thickness of the base layer in the release film of Comparative Example 2 was 50 μm±10%. The thickness of the surface layer of the release film of Comparative Example 2 was 5.5±0.5 μm.

The trouser tear strength of the release film of Comparative Example 2 was measured according to JIS K7128-1 and found to be 27.77 N/m. The peeling force of the resin composition (RA-2) in the release film was measured at 175° C. according to JIS Z0237 and found to be 36 mN/30 mm.

Example 4

As a base layer, a film formed of an easily moldable polyethylene terephthalate resin (Emblet (registered trademark) CTK-38, Unitika Ltd., thickness 38 μm, glass transition temperature 65° C.) was prepared.

The resin composition (A-1) was applied onto both surfaces of the film. After the application, these compositions were cured by heating at 150° C. for 60 seconds, and a release film in which a fluororesin layer was laminated on both sides of an easily moldable PET resin film (hereinafter, referred to as "release film of Example 4") was obtained.

The thickness of the release film of Example 4 was 60±5 μm. The thickness of the base layer in the release film of Example 4 was 38 μm±10%. The thickness of the surface layer of the release film of Example 4 was 5.5±0.5 μm.

The trouser tear strength of the release film of Example 4 was measured according to JIS K7128-1 and found to be 12.41 N/mm. The peeling force of the resin composition (A-1) in the release film was measured at 175° C. according to JIS Z0237 and found to be 8.5 mN/30 mm.

Example 5

As a base layer, a film formed of a normal polyethylene terephthalate resin (Tetoron (registered trademark) G2CW, Teijin Limited, thickness 38 μm, glass transition temperature 100° C.) was prepared.

The resin composition (A-1) was applied onto both surfaces of the film. After the application, these compositions were cured by heating at 150° C. for 60 seconds, and a release film in which a fluororesin layer was laminated on both sides of an easily moldable PET resin film (hereinafter, referred to as "release film of Example 5") was obtained.

The thickness of the release film of Example 5 was 60±5 μm. The thickness of the base layer in the release film of Example 5 was 38 μm±10%. The thickness of the surface layer of the release film of Example 5 was 5.5 t 0.5 μm.

The trouser tear strength of the release film of Example 5 was measured according to JIS K7128-1 and found to be 6.29 N/mm. The peeling force of the resin composition (A-1) in the release film was measured at 175° C. according to JIS Z0237 and found to be 8.5 mN/30 mm.

TABLE 2

| | Example 1 | Example 2 | Example 3 | Example 4 | Example 5 | Comparative Example 1 | Comparative Example 2 |
|---|---|---|---|---|---|---|---|
| Resin composition | A-1 | A-2 | A-3 | A-1 | A-1 | RA-1 | RA-2 |
| Trouser tear strength (N/mm) | 27.77 | 27.77 | 27.77 | 12.41 | 6.29 | 27.77 | 27.77 |
| Peeling force (mN/30 mm) | 8.5 | 8.5 | 8.5 | 8.5 | 8.5 | 8.5 | 36 |

| Resin composition | Commercially available release film 1 | Commercially available release film 2 |
|---|---|---|
| Trouser tear strength (N/mm) | 23.62 | 1.75 |
| Peeling force (mN/30 mm) | 16.5 | 23.5 |

(Suitability of Release Film for Multi-Shot Molding)

The release film of Comparative Example 1 was used to perform molding of an epoxy resin by transfer molding. The molding was performed as shown in FIG. 2. The molding was performed so that the layer formed of the molded article of the fluororesin composition was in contact with the mold and the layer formed of the molded article of the fluororesin composition was in contact with the epoxy resin. Next, the release film used in the above molding was used to perform the same molding once again. The same release film was used for the same molding twice more, and the molding was performed four times in total with the single release film.

The release film of Example 1 was used to perform sealing the semiconductor element with the epoxy resin four times in the same manner as that in Comparative Example 1.

The release films of Examples 2 to 5 were also used to perform molding of an epoxy resin by transfer molding four times in the same manner as that in Comparative Example 1.

The molded article of an epoxy resin was smoothly released from each release film of Examples 1 to 5 after each of the first molding to the fifth molding. This has revealed that the release films of Examples 1 to 5 have excellent mold release properties and that the mold release properties are maintained through multiple molding operations.

The release films of Examples 1 to 5 were used continuously in at least four moldings.

Further, when the molding was further performed a plurality of times, the release films of Examples 1 and 2 were broken in the 10th and 10th moldings, respectively. The release film of Example 3 was broken in the fifth molding. Therefore, the release films of Examples 1 and 2 can be used for molding more times than the release film of Example 3. That is, the release films of Examples 1 and 2 have better suitability of release film for multi-shot molding than the release film of Example 3.

The above results of the suitability for multi-shot molding as well as the trouser tear strength reveal that by adjusting the trouser tear strength of the release film, the resulting release film can be used for molding more times.

The trouser tear strength of the release film of Comparative Example 1 was 6 N/mm as described above. The release film of Comparative Example 1 was further used to perform molding multiple times and was broken in the 10th molding.

In addition, two types of release films available on the market were prepared. The trouser tear strength of the first release film was 23.62 N/mm as measured by the above-mentioned measuring method. The trouser tear strength of the second release film was 1.75 N/mm as measured by the above-mentioned measuring method. These two release films were attempted to perform molding multiple times as described above. As a result, the first release film was broken in the third molding. The second release film was broken in the second molding.

The results of suitability for multi-shot molding for the release films of Examples 1 to 5 and Comparative Example 1 and the commercially available release films (hereinafter referred to as commercially available release films 1 and 2) and the trouser tear strengths of these films reveal that when the release film has a trouser tear strength of 5 N/mm or more, the resulting release film can be used for sealing more times.

DESCRIPTION OF REFERENCE NUMERAL

100: Release film
101: Base layer
102: Surface layer
103: Surface layer

The invention claimed is:

1. A release film having a base layer formed of a thermoplastic resin and a surface layer formed of a resin composition laminated on at least one surface of the base layer, wherein the trouser tear strength in accordance with JIS K7128-1 is 5 N/mm or more, the peeling force of the resin composition is 15 mN/30 mm or less when measured at 175° C. according to JIS Z0237, and the breaking point elongation of the resin composition is 70% or more when measured at 175° C. according to JIS K7127;
    wherein the resin composition contains isocyanurate type polyisocyanate and adduct-type polyisocyanate and a tetrafluoroethylene resin,
    wherein an amount of the isocyanurate-type polyisocyanate is 8.6 parts by mass to 12.9 parts by mass with respect to 100 parts by mass of the tetrafluoroethylene resin, and
    wherein an amount of the adduct-type polyisocyanate is 2.6 parts by mass to 10.4 parts by mass with respect to 100 parts by mass of the tetrafluoroethylene resin.

2. The release film according to claim 1, which is used in sealing of a semiconductor to be flip-chip connected.

3. The release film according to claim 1, which is used for molding two or more times.

* * * * *